United States Patent
Chang

(10) Patent No.: US 7,453,748 B2
(45) Date of Patent: Nov. 18, 2008

(54) DRAM BIT LINE PRECHARGE VOLTAGE GENERATOR

(75) Inventor: Chien Yi Chang, Hsinchu (TW)

(73) Assignee: Elite Semiconductor Memory Technology Inc. (TW)

( * ) Notice: Subject to any disclaimer, the term of this patent is extended or adjusted under 35 U.S.C. 154(b) by 327 days.

(21) Appl. No.: 11/513,167

(22) Filed: Aug. 31, 2006

(65) Prior Publication Data

US 2008/0056037 A1 Mar. 6, 2008

(51) Int. Cl.
*G11C 7/00* (2006.01)
(52) U.S. Cl. .............. 365/203; 365/189.07; 365/189.09
(58) Field of Classification Search .................. 365/203, 365/189.07, 189.09
See application file for complete search history.

(56) References Cited

U.S. PATENT DOCUMENTS

| | | | |
|---|---|---|---|
| 5,255,232 A | 10/1993 | Foss et al. | |
| 6,265,858 B1 | 7/2001 | Park | |
| 6,559,707 B1 * | 5/2003 | Hwang | 327/390 |
| 6,687,166 B1 * | 2/2004 | Takahashi et al. | 365/189.05 |
| 6,687,639 B2 * | 2/2004 | Taniguchi et al. | 702/117 |

* cited by examiner

*Primary Examiner*—Son Dinh
(74) *Attorney, Agent, or Firm*—Oliff & Berridge, PLC

(57) ABSTRACT

A DRAM bit line precharge voltage generator comprises a first amplifier having a first current source and comparing a first voltage with a precharge voltage to control a first PMOS transistor, a second amplifier having a second current source and comparing a second voltage with the precharge voltage to control a second PMOS transistor, a third amplifier having a third current source and comparing a third voltage with the precharge voltage to control a first NMOS transistor, and a fourth amplifier having a fourth current source and comparing the first voltage with the precharge voltage to control a second NMOS transistor. The precharge voltage feedbacks from an output node connected between the second PMOS transistor and the first NMOS transistor. The DRAM bit line precharge voltage generator with a low-frequency pole provided by the first amplifier, the first PMOS transistor, the fourth amplifier, and the second NMOS transistor exhibits the characteristics of robustness, low standby current and low-output impedance.

20 Claims, 8 Drawing Sheets

DRAM BIT LINE PRECHARGE VOLTAGE GENERATOR

BACKGROUND OF THE INVENTION

1. Field of the Invention

The present invention relates to a dynamic random access memory (DRAM) bit line precharge voltage generator, and more particularly, to a DRAM bit line precharge voltage generator employing the feedback of the output signal thereof.

2. Description of the Related Art

A DRAM needs a highly stable bit line precharge voltage to meet the requirement of the long refresh cycle, so the bit line precharge voltage generator must present the characteristics of easy stabilization and low-output impedance. Generally, the DRAM bit line precharge voltage generator applies a precharge voltage to the bit line of the semiconductor device, the precharge voltage having a value corresponding to half of a supply voltage, $(V_{cc}-V_{ss})/2$ (refer to FIG. 1).

In U.S. Pat. No. 5,255,232 (hereinafter '232), a DRAM bit line precharge voltage generator is disclosed. FIG. 1 shows a circuit diagram of the DRAM precharge voltage generator 1 in '232. The precharge voltage generator 1 comprises a first voltage divider 10 for generating a first divided-voltage signal $V_{D1}$ and a second divided-voltage signal $V_{D2}$, and an output circuit 12 for generating a precharge voltage $V_{pre}$ in response to the first and second divided-voltage signals $V_{D1}$ and $V_{D2}$.

The first voltage divider 10 comprises a first PMOS transistor M1 connected between a supply voltage source $V_{cc}$ and a first node S1, a first NMOS transistor M2 connected between the first node S1 and a second node S2, a second PMOS transistor M3 connected between the second node S2 and a third node S3, and a second NMOS transistor M4 connected between the third node S3 and a ground voltage source $V_{ss}$. The first PMOS transistor M1 has a gate connected to the ground voltage source $V_{ss}$, and thus functions as a fixed resistor having a fixed resistance. Also, the second NMOS transistor M4 has a gate connected to the supply voltage source $V_{cc}$, and thus functions as a fixed resistor having a fixed resistance. Therefore, the sizes of the first PMOS transistor M1 and the second NMOS transistor M4 could determine the voltage at the output node S4 and limit the current flowing from the supply voltage source $V_{cc}$ to the ground voltage source $V_{ss}$ through the first voltage divider 10. On the other hand, the first NMOS transistor M2 has a gate connected to a drain thereof, and thus acts as an active resistor having a resistance that is reduced as a supply voltage (i.e., $V_{cc}-V_{ss}$) from the supply voltage source $V_{cc}$ is increased in level. Also, the second PMOS transistor M3 has a gate connected to a drain thereof, and thus acts as an active resistor having a resistance that is increased as the supply voltage from the supply voltage source $V_{cc}$ is increased in level.

The output circuit 12 comprises a third NMOS transistor M5 connected between the supply voltage source $V_{cc}$ and the output node S4, and a third PMOS transistor M6 connected between the output node S4 and the ground voltage source $V_{ss}$. The gate of the third NMOS transistor M5 receives the first divided-voltage signal $V_{D1}$ from the first node S1, and the gate of the third PMOS transistor M6 receives the second divided-voltage signal $V_{D2}$ from the third node S3. The third NMOS transistor M5 has a resistance that is gradually increased as the first divided-voltage signal $V_{D1}$ is decreased in level. Conversely, the third PMOS transistor M6 has a resistance that is decreased as the second divided-voltage signal $V_{D2}$ is decreased in level. If the resistances of the first PMOS transistor M1 and the second NMOS transistor M4 are sufficiently large and equivalent, and the voltage of the second node S2 becomes a half $V_{cc}$ voltage. In general, the sizes of the first NMOS transistor M2 and the second PMOS transistor M3 are similar to those of the third NMOS transistor M5 and the third PMOS transistor M6, respectively. When operating, the voltage of the first node S1 is equal to the voltage of the second node S2 plus the threshold voltage $V_{th2}$ of the first NMOS transistor M2. When the precharge voltage $V_{pre}$ at the output node S4 drops from the half $V_{cc}$ voltage, the gate-source voltage of the third NMOS transistor M5 is increased and larger than the threshold voltage of the first NMOS transistor M2, and then the third NMOS transistor M5 is turned on to increase the precharge voltage $V_{pre}$. The operation between the second PMOS transistor M3 and the third PMOS transistor M6 is similar to that between the first NMOS transistor M2 and the third NMOS transistor M5 and therefore is skipped here.

The disadvantages of the DRAM precharge voltage generator 1 are described as follows. The third NMOS transistor M5 cannot be turned off absolutely due to the gate-source voltage applied thereon close to the threshold voltage thereof, and the same situation applies to the third PMOS transistor M6. In addition, the sizes of the third NMOS transistor M5 and the third PMOS transistor M6 should be large enough to provide sufficient current to the precharge line. Therefore, a large leakage current flows from the supply voltage source $V_{cc}$ to the ground voltage source $V_{ss}$ through the output circuit 12.

FIG. 2 is an I-V relationship diagram regarding the precharge current $I_{pre}$ and the precharge voltage $V_{pre}$ at the output node S4. Curve A is an I-V curve of an ideal precharge voltage generator, in which a large precharge current is provided to recover the precharge voltage back to the half $V_{cc}$ voltage when the precharge voltage deviates from the half $V_{cc}$ voltage. That is, Curve A shows a better capability to suppress the precharge voltage deviation. However, Curve B, the I-V curve of the DRAM precharge voltage generator 1, shows that the deviated precharge voltage cannot recover until it achieves a larger deviation, e.g., $V_d$. As a result, the precharged voltage $V_{pre}$ generated by the DRAM precharge voltage generator 1 presents a larger deviation.

As shown in FIG. 3, U.S. Pat. No. 6,265,858 (hereinafter '858) discloses a voltage-adjusting circuit functioning as a DRAM bit line precharge voltage generator. The voltage-adjusting circuit 2 comprises a reference voltage-generating circuit 20, a comparing circuit 21, and an output circuit 22. The reference voltage-generating circuit 20 comprises first and second transistors QP10, QP11, first and second resistors R10, R12, and a variable resistor R11. The first and second transistors QP10, QP11 are substantially equivalent in size and are of a diode PMOS type, and the first and second resistors R10, R12 have resistances substantially higher than that of the variable resistor R11. The first resistor R10 and the second resistor R12 also have substantially equivalent resistances. The comparing circuit 21 comprises first and second differential amplifiers DA1 and DA2. The first differential amplifier DA1 has first and second inputs coupled to a first node N10 and a precharge voltage $V_{pre}$. The first differential amplifier DA1 compares a first reference voltage $V_{ref1}$ at an inverted terminal with the precharge voltage $V_{pre}$, from a first output terminal 50 at a non-inverted terminal and generates a first control signal CS1. The second differential amplifier DA2 has first and second inputs coupled to a second node N11 and the precharge voltage $V_{pre}$. The second differential amplifier DA2 compares a second reference voltage $V_{ref2}$ at an inverted terminal with the precharge voltage $V_{pre}$ at a non-inverted terminal and generates a second control signal CS2.

The output circuit 22 comprises a third transistor QP12 of the PMOS type and a fourth transistor QN10 of the NMOS type coupled in series between the supply voltage source $V_{cc}$ and the ground voltage source $V_{ss}$, and is controlled according to the first and second control signals CS1, CS2. The gate electrode of the third transistor QP12 receives the second control signal CS2, whereas the gate electrode of the fourth transistor QN10 receives the first control signal CS1. First electrodes of the third and fourth transistors QP12, QN10 are coupled to the supply voltage source $V_{cc}$ and the ground voltage source $V_{ss}$, respectively. Second electrodes of the third and fourth transistors QP12, QN10 are commonly coupled at a third node N12 to the precharge voltage $V_{pre}$. In operation, the first reference voltage $V_{ref1}$ of $V_{cc}/2+\Delta V$ is applied to the first node N10, and the second reference voltage $V_{ref2}$ of $V_{cc}/2-\Delta V$ is applied to the second node N11. If the precharge voltage $V_{pre}$ is less than the first reference voltage $V_{ref1}$ and larger than the second reference voltage $V_{ref2}$, the third transistor QP12 and the fourth transistor QN10 are both transited to "OFF" state. Thus, the precharge voltage $V_{pre}$ is not varied. If the precharge voltage $V_{pre}$ is less than the second reference voltage $V_{ref2}$, the third transistor QP12 and the fourth transistor QN10 are transited to "ON" state and "OFF" state, respectively. As a result, the current flows to the third node N12 through the third transistor QP12, thereby stably maintaining the level of the precharge voltage $V_{pre}$. Alternatively, when the level of the precharge voltage $V_{pre}$ is larger than the first reference voltage $V_{ref1}$, the first and second control signals CS1, CS2 are transited to "HIGH" level. Accordingly, the third transistor QP12 and the fourth transistor QN10 are transited to "OFF" state and "ON" state, respectively. As a result, the current flows to the ground voltage source $V_{ss}$ via the fourth transistor QN10, thereby stably maintaining the level of the precharge voltage $V_{pre}$.

FIG. 4 shows a relationship diagram regarding the precharge current $I_{pre}$ and the precharge voltage $V_{pre}$ at the third node N12. A dead zone exists between $V_{ref2}$ and $V_{ref1}$, i.e., there is no leakage current (i.e., $I_{pre}$) flowing through the third transistor QP12 or the fourth transistor QN10 when the precharge voltage $V_{pre}$ is within the dead zone. In comparison with Curve B of FIG. 2, the I-V curve of FIG. 4 is sharper when the precharge voltage $V_{pre}$ deviates from half $V_{cc}$ and out of the dead zone. However, an unstable issue may occur in the voltage-adjusting circuit 2. The circuit portion comprising the first differential amplifier DA1 and the fourth transistor QN10 equivalently forms an RC circuit, and the RC circuit contributes a pole; similarly, another pole is formed by the second differential amplifier DA2 and the third transistor QP12. From the view of feedback control theory, two poles are involved in the voltage-adjusting circuit 2 that utilizes the precharge voltage $V_{pre}$ as a feedback signal and the locations of the two poles in the s-plane have to be designed carefully to avoid oscillation of the precharge voltage $V_{pre}$.

FIG. 5 illustrates the Bode gain plots and Bode phase plots of two feedback systems. For a stable feedback system, its gain drops below 0 dB with a phase above negative 180 degrees at the gain crossover frequency $W_{gc}$ (refer to Curves C and C'). However, for an unstable feedback system, its phase drops below negative 180 degrees before its gain drops blow 0 dB at the gain crossover frequency $W_{gc}$, (refer to Curves D and D').

In general, for high-density DRAMs, e.g., capacity above 128 Mb, the MOS transistors used in the output circuit 22 of the voltage-adjusting circuit 2 are large enough to drive the bit line. That is, the equivalent capacitances of the MOS transistors are also large enough, and thus, poles contributed by large capacitances will be located at low-frequency regions in the frequency spectrum. A low-frequency pole introduced would cause the Bode gain plot of a feedback system to begin to drop at a lower frequency, and makes a lower gain crossover frequency (refer to FIG. 5), in which the feedback system becomes stable. Therefore, there is no stable issue for the voltage-adjusting circuit used for high-density DRAMs. However, for low-density DRAMs, e.g., capacity below 16 Mb, some failure modes that result in leakage current in the bit line are caused by current manufacturing process technology. To compensate for the leakage current in the low-density DRAMs, the MOS transistors used in the voltage-adjusting circuit 2 have to be designed with high driving capacity (i.e., large size), or the small equivalent RC value that contributes high-frequency poles will be apt to cause the voltage-adjusting circuit 2 to be unstable.

SUMMARY OF THE INVENTION

The objective of the present invention is to provide a DRAM bit line precharge voltage generator, which utilizes the output signal thereof as a feedback signal, to eliminate the issues of large leakage current and low stability in the prior arts.

Another objective of the present invention is to provide a DRAM bit line precharge generator with a low-frequency pole provided by two amplifiers to exhibit the characteristics of robustness, low standby current low-output impedance.

In order to achieve the objectives, a DRAM bit line precharge voltage generator of a first embodiment is disclosed. The DRAM bit line precharge voltage generator comprises a first amplifier having a first current source, a second amplifier having a second current source, a third amplifier having a third current source, a fourth amplifier having a fourth current source, a first PMOS transistor, a second PMOS transistor, a first NMOS transistor, and a second NMOS transistor. The first amplifier compares a first voltage with a precharge voltage to control the first PMOS transistor. The second amplifier compares a second voltage with the precharge voltage to control the second PMOS transistor. The third amplifier compares a third voltage with the precharge voltage to control the first NMOS transistor. The fourth amplifier compares the first voltage with the precharge voltage to control the second NMOS transistor. The first PMOS transistor is coupled to a supply voltage source through the drain thereof. The second PMOS transistor is coupled to the source of the first PMOS transistor through the drain thereof. The first NMOS transistor is coupled to the source of the second PMOS transistor through the drain thereof. The second NMOS transistor is coupled to the source of the first NMOS transistor through the drain thereof and to a ground voltage source. The precharge voltage is retrieved from an output node connected between the second PMOS transistor and the first NMOS transistor. Each amplifier and its corresponding transistor exhibit an equivalent RC (resistance-capacitance) circuit with an RC value, i.e., the product of the resistance and the capacitance thereof. The first and the fourth amplifiers and their corresponding transistors with large RC values introduce a low-frequency pole in the s-plane to achieve the characteristics of robustness, low standby current and low-output impedance.

A DRAM bit line precharge voltage generator of a second embodiment comprises a first amplifier having a first current source, a second amplifier having a second current source, a third amplifier having a third current source, a fourth amplifier having a fourth current source, a first PMOS transistor, a second PMOS transistor, a first NMOS transistor, a second NMOS transistor, and a voltage divider. The first amplifier compares a first precharge voltage with a reference voltage to control the first PMOS transistor. The second amplifier compares a second precharge voltage with the reference voltage to control the second PMOS transistor. The third amplifier compares a precharge voltage with the reference voltage to control the first NMOS transistor. The fourth amplifier compares the first precharge voltage with the reference voltage to control the second NMOS transistor. The first PMOS transistor is coupled to a supply voltage source through the drain thereof. The second PMOS transistor is coupled to the source of the first PMOS transistor through the drain thereof. The first NMOS transistor is coupled to the source of the second PMOS transistor through the drain thereof. The second NMOS transistor is coupled to the source of the first NOMS transistor through the drain thereof and to a ground voltage source. The precharge voltage is retrieved from an output node connected between the second PMOS transistor and the first NMOS transistor. The first and the fourth amplifiers and their corresponding transistors with large RC values introduce a low-frequency pole in the s-plane. The voltage divider is used to generate the first precharge voltage and the second precharge voltage according to the supply voltage source and the precharge voltage and to determine a lower boundary of the precharge voltage. In this embodiment, the reference voltage is an upper boundary of the precharge voltage.

A DRAM bit line precharge voltage generator of a third embodiment comprises a first amplifier having a first current source, a second amplifier having a second current source, a third amplifier having a third current source, a fourth amplifier having a fourth current source, a first PMOS transistor, a second PMOS transistor, a first NMOS transistor, a second NMOS transistor, and a voltage divider. The first amplifier compares a first precharge voltage with a reference voltage to control the first PMOS transistor. The second amplifier compares a precharge voltage with the reference voltage to control the second PMOS transistor. The third amplifier compares a second precharge voltage with the reference voltage to control the first NMOS transistor. The fourth amplifier compares the first precharge voltage with the reference voltage to control the second NMOS transistor. The first PMOS transistor is coupled to a supply voltage source through the drain thereof. The second PMOS transistor is coupled to the source of the first PMOS transistor through the drain thereof. The first NMOS transistor is coupled to the source of the second PMOS transistor through the drain thereof. The second NMOS transistor is coupled to the source of the first NOMS transistor through the drain thereof and to a ground voltage source. The precharge voltage is retrieved from an output node connected between the second PMOS transistor and the first NMOS transistor. The first and the fourth amplifiers and their corresponding transistors with large RC values introduce a low-frequency pole in the s-plane. The voltage divider is used to generate the first precharge voltage and the second precharge voltage according to the ground voltage source and the precharge voltage and to determine an upper boundary of the precharge voltage. In this embodiment, the reference voltage is a lower boundary of the precharge voltage.

In the above three embodiments, the equivalent resistance of each amplifier can be changed by adjusting the current of the corresponding current source; the equivalent capacitance of each transistor can be adjusted by changing the size of the corresponding transistor.

BRIEF DESCRIPTION OF THE DRAWINGS

The invention will be described according to the appended drawings in which.

DETAILED DESCRIPTION OF THE INVENTION

Figure 6:
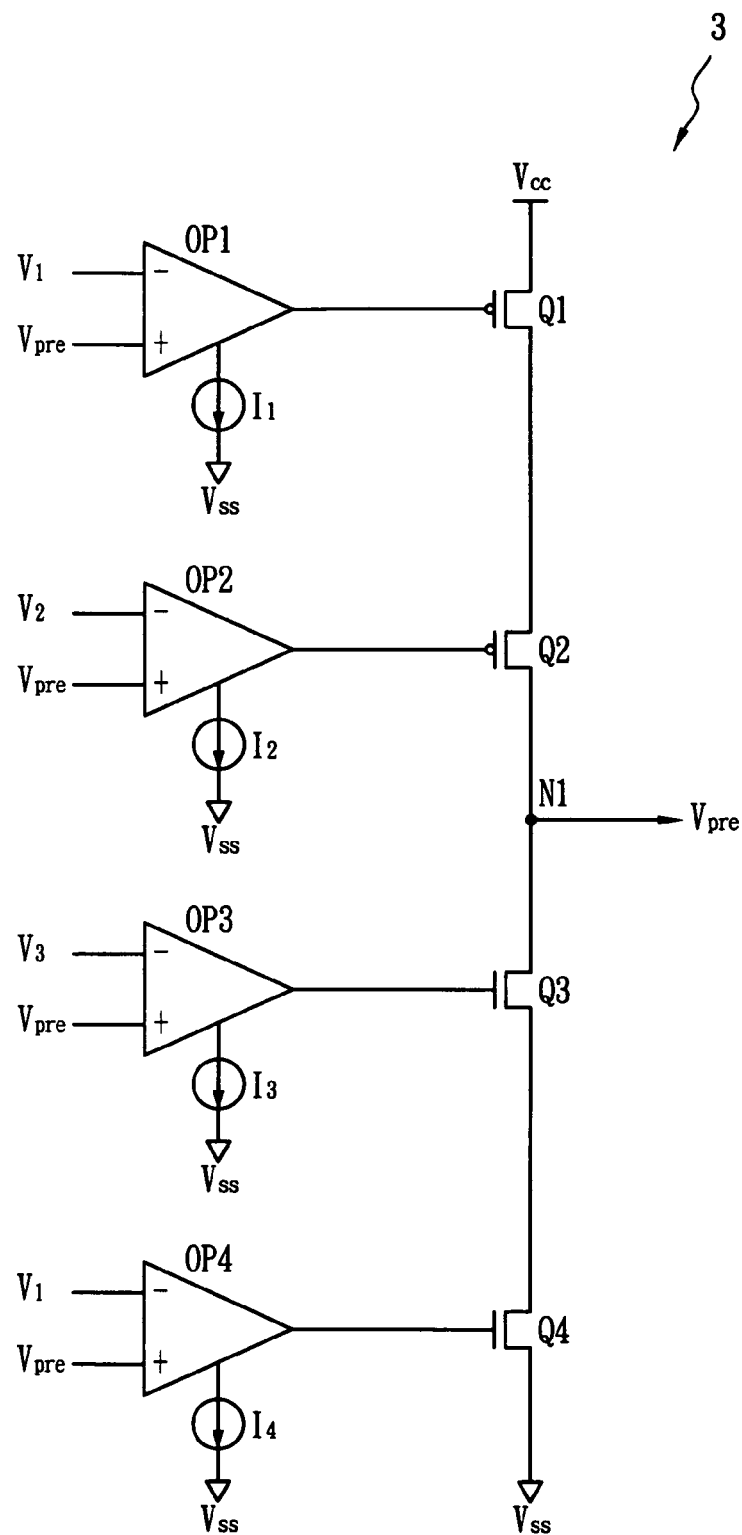
FIG. 6 illustrates the DRAM bit line precharge voltage generator in accordance with a first embodiment of the present invention.

FIG. 6 shows a DRAM bit line precharge voltage generator 3 in accordance with the first embodiment of the present invention. The DRAM bit line precharge voltage generator 3 comprises a first amplifier OP1 having a first current source $I_1$, a second amplifier OP2 having a second current source $I_2$, a third amplifier OP3 having a third current source $I_3$, a fourth amplifier OP4 having a fourth current source $I_4$, a first PMOS transistor Q1, a second PMOS transistor Q2, a first NMOS transistor Q3, and a second NMOS transistor Q4. The first PMOS transistor Q1 is coupled to a supply voltage source $V_{cc}$ through the drain thereof and to the output of the first amplifier OP1 through the gate thereof. The second PMOS transistor Q2 is coupled to the source of the first PMOS transistor Q1 through the drain thereof and to the output of the second amplifier OP2 through the gate thereof. The first NMOS transistor Q3 is coupled to the source of the second PMOS transistor Q2 through the drain thereof and to the output of the third amplifier OP3 through the gate thereof. The second NMOS transistor Q4 is coupled to the source of the first NMOS transistor Q3 through the drain thereof, to the output of the fourth amplifier OP4 through the gate thereof, and to a ground voltage source $V_{ss}$. The first amplifier OP1 compares a first voltage $V_1$ with a precharge voltage $V_{pre}$ to control the first PMOS transistors Q1. $V_{pre}$ is retrieved from an output node N1 connected to the second PMOS transistor Q2 and the first NMOS transistor Q3. The second amplifier OP2 compares a second voltage $V_2$ with the precharge voltage $V_{pre}$ to control the second PMOS transistor Q2. The third amplifier OP3 compares a third voltage $V_3$ with the precharge voltage $V_{pre}$ to control the first NMOS transistor Q3. The fourth amplifier OP4 compares the first voltage $V_1$ with the precharge voltage $V_{pre}$ to control the second NMOS transistor Q4.

An amplifier and a transistor can be considered an equivalent resistance and an equivalent capacitance, respectively. Therefore, the first amplifier OP1 and the first PMOS transistor Q1 contribute a first RC value; the second amplifier OP2 and the second PMOS transistor Q2 contribute a second RC value; the third amplifier OP3 and the first NMOS transistor Q3 contribute a third RC value; the fourth amplifier OP4 and the second NMOS transistor Q4 contribute a fourth RC value. The RC value is equivalent to the product of the resistance and the capacitance. The first RC value is larger than the second RC value, and the fourth RC value is larger than the third RC value. The first voltage $V_1$, the second voltage $V_2$, and the third voltage $V_3$ are reference voltages provided externally.

Figure 1:
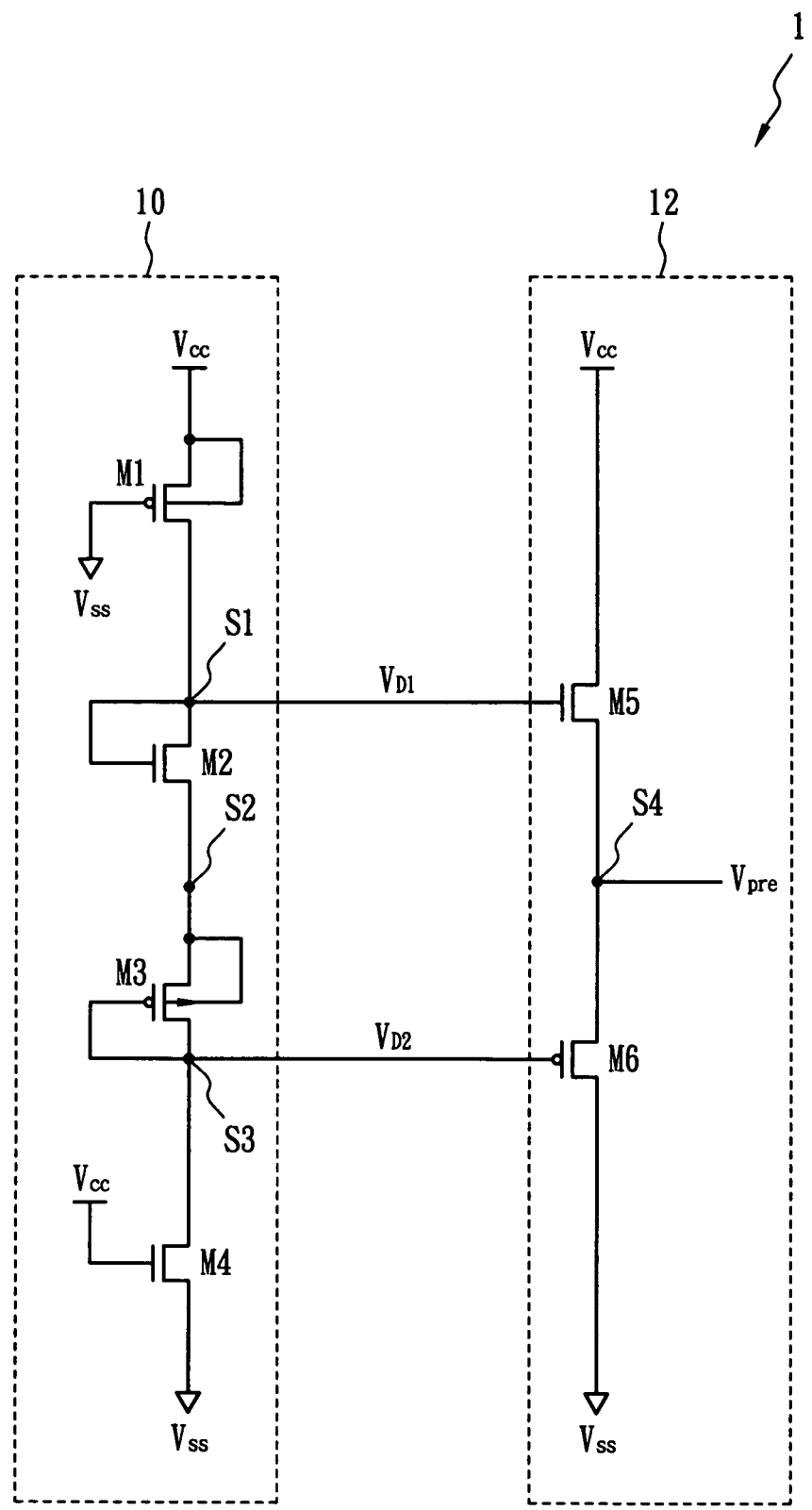
FIG. 1 shows a known DRAM bit line precharge voltage generator.
Figure 2:
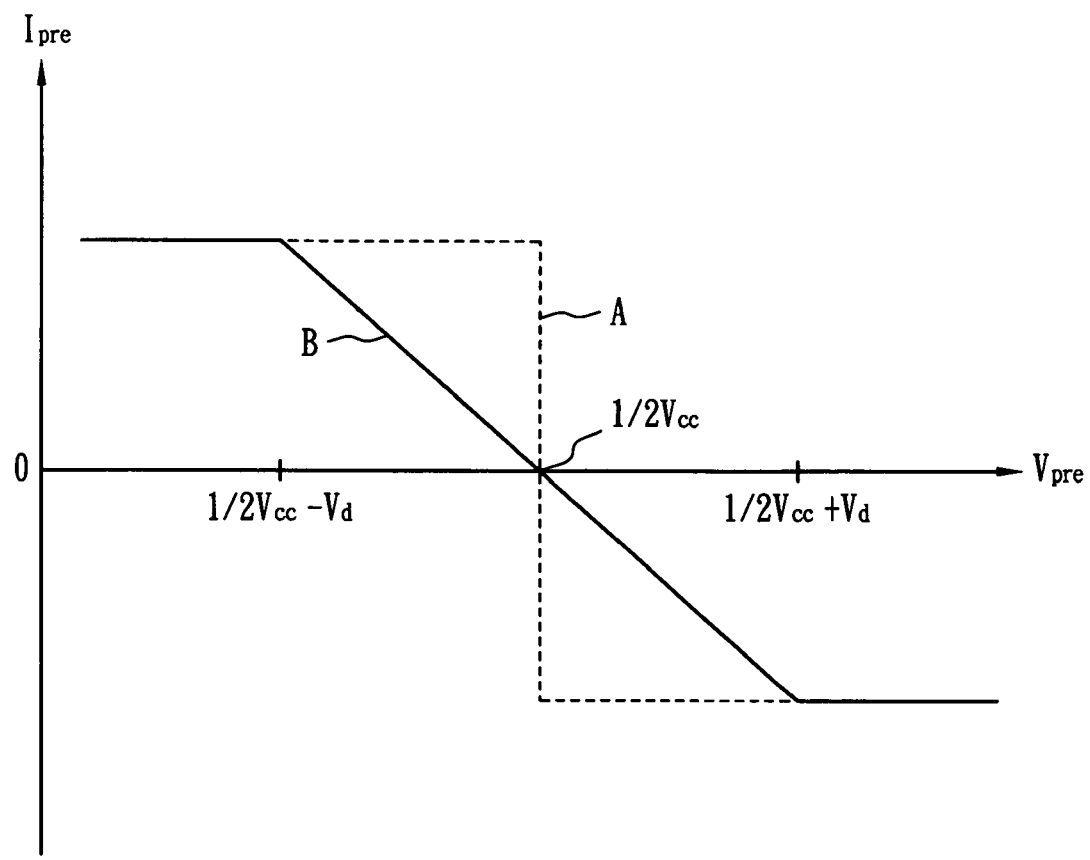
FIG. 2 shows an I-V relationship diagram in connection with FIG. 1.
Figure 3:
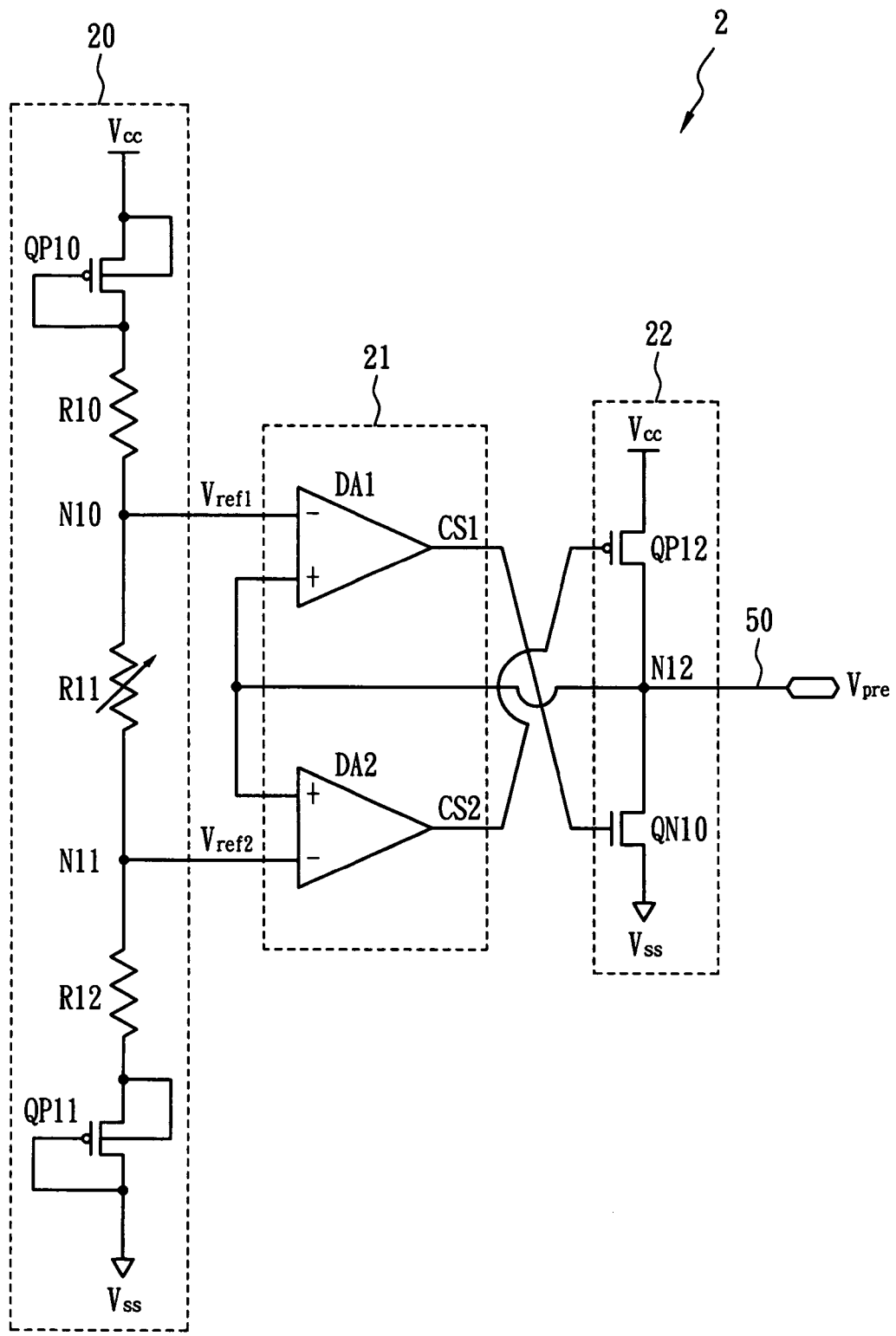
FIG. 3 shows another known DRAM bit line precharge voltage generator.
Figure 4:
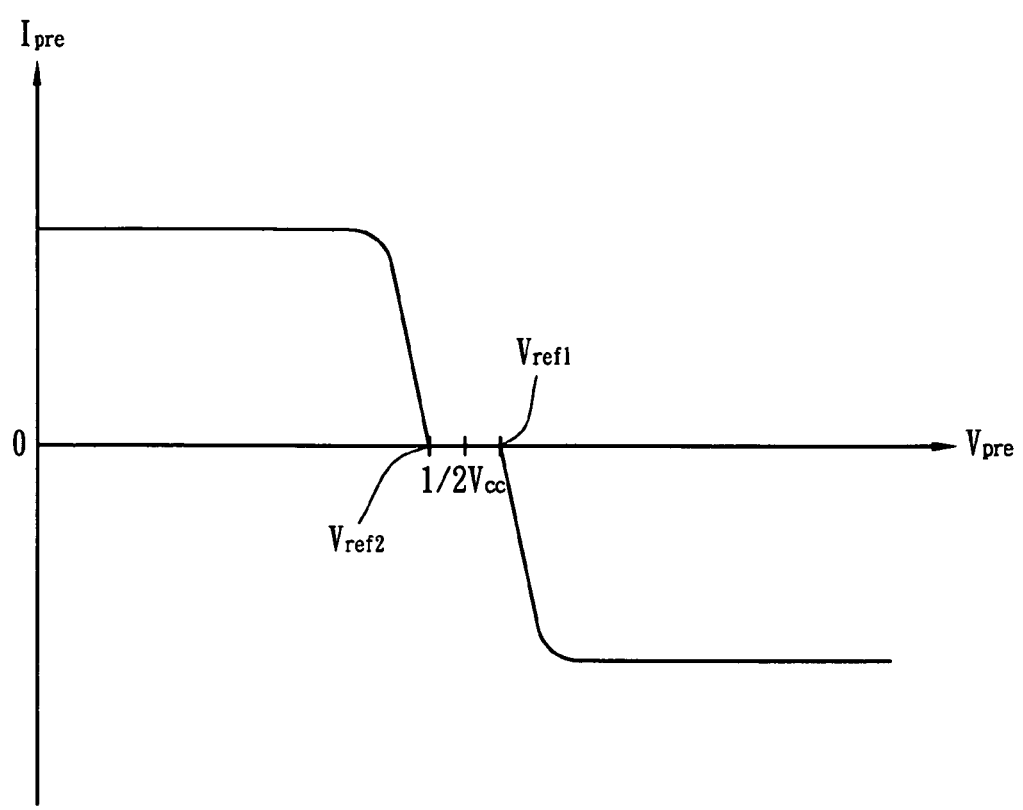
FIG. 4 shows an I-V relationship diagram in connection with FIG. 3.

The third voltage $V_3$ and the second voltage $V_2$ are the upper and the lower boundaries of the precharge voltage $V_{pre}$, respectively. According to the circuit shown in FIG. 6, the third voltage $V_3$ and the second voltage $V_2$ can be provided from the first node N10 and the second node N11, respectively (refer to FIG. 3). The first voltage $V_1$ is between the second voltage $V_2$ and the third voltage $V_3$. That is, the relationship of $V_3 > V_1 > V_2$ exists. Preferably, the first voltage $V_1$ is the mean value of the second voltage $V_2$ and the third voltage $V_3$, i.e., $(V_2+V_3)/2$.

Figure 5:
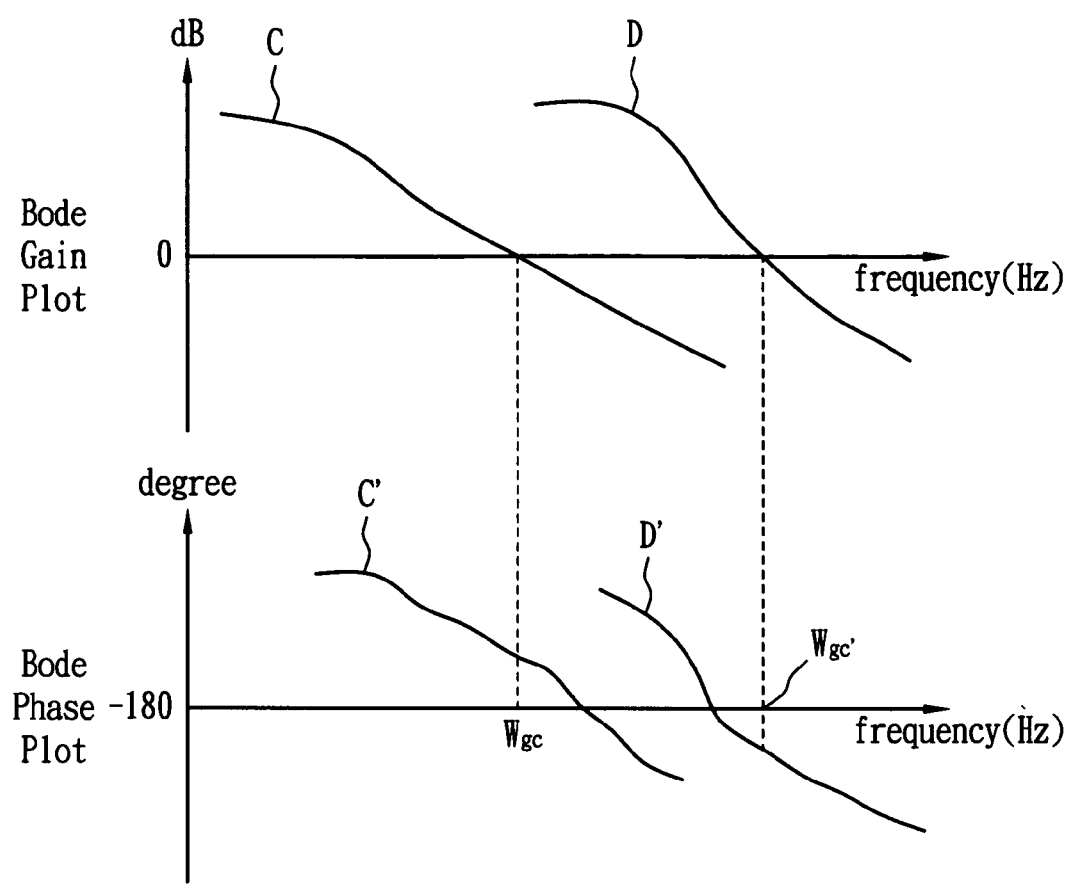
FIG. 5 illustrates the Bode gain plots and the Bode phase plots of two feedback systems.

A higher RC value corresponds to a lower-frequency pole. Therefore, by adding a low-frequency pole that is lower than the gain crossover frequency $W_{gc}$, (refer to FIG. 5), the unstable feedback system of FIG. 5 could become a stable system whose gain drops below 0 dB before its phase drops to negative 180 degrees. In comparison with the comparing circuit 21 and the output circuit 22 of FIG. 3, the DRAM bit line precharge voltage generator 3 of the first embodiment of the present invention further comprises two amplifiers OP1, OP4 and two transistors Q1, Q4 to introduce a low-frequency pole. To introduce the low-frequency pole, the sizes of the first PMOS transistor Q1 and the second NMOS transistor Q4 are larger than those of the second PMOS transistor Q2 and the first NMOS transistor Q3, respectively. Preferably, the sizes of the first PMOS transistor Q1 and the second NMOS transistor Q4 are at least ten times those of the second PMOS transistor Q2 and the first NMOS transistor Q3, respectively.

Another way to introduce the low-frequency pole is that the currents of the second current source $I_2$ and the third current source $I_3$ are designed to be larger than those of the first current source $I_1$ and the fourth current source $I_4$, respectively. To simplify the circuit, the third current source $I_3$ and the fourth current source $I_4$ could be replaced with the second current source $I_2$ and the first current source $I_1$, respectively, in which the current of the second current source $I_2$ remains larger than that of the first current source $I_1$.

The operation of the first embodiment of the present invention is given below. Referring to FIG. 6, because $V_2 < V_1 < V_3$ as mentioned above, if the precharge voltage $V_{pre}$ is less than the second voltage $V_2$, the precharge voltage $V_{pre}$ will be less than the first voltage $V_1$ and the third voltage $V_3$ also, i.e., $V_{pre} < V_1$ and $V_{pre} < V_3$. Therefore, the first PMOS transistor Q1 and the second PMOS transistor Q2 are turned on; however, the first NMOS transistor Q3 and the second NMOS transistor Q4 are turned off. As a result, the level of the precharge voltage $V_{pre}$ is increased.

If the precharge voltage $V_{pre}$ is larger than the third voltage $V_3$, the precharge voltage $V_{pre}$ is larger than the first voltage $V_1$ and the second voltage $V_2$, i.e., $V_{pre} > V_1$ and $V_{pre} > V_2$. Accordingly, the first PMOS transistor Q1 and the second PMOS transistor Q2 are turned off; however, the first NMOS transistor Q3 and the second NMOS transistor Q4 are turned on. As a result, the precharge voltage $V_{pre}$ is decreased.

When the precharge voltage $V_{pre}$ is between the third voltage $V_3$ and the second voltage $V_2$, the second PMOS transistor Q2 and the first NMOS transistor Q3 are turned off; thus, the precharged voltage $V_{pre}$ remains and a low standby current is obtained.

Figure 7:
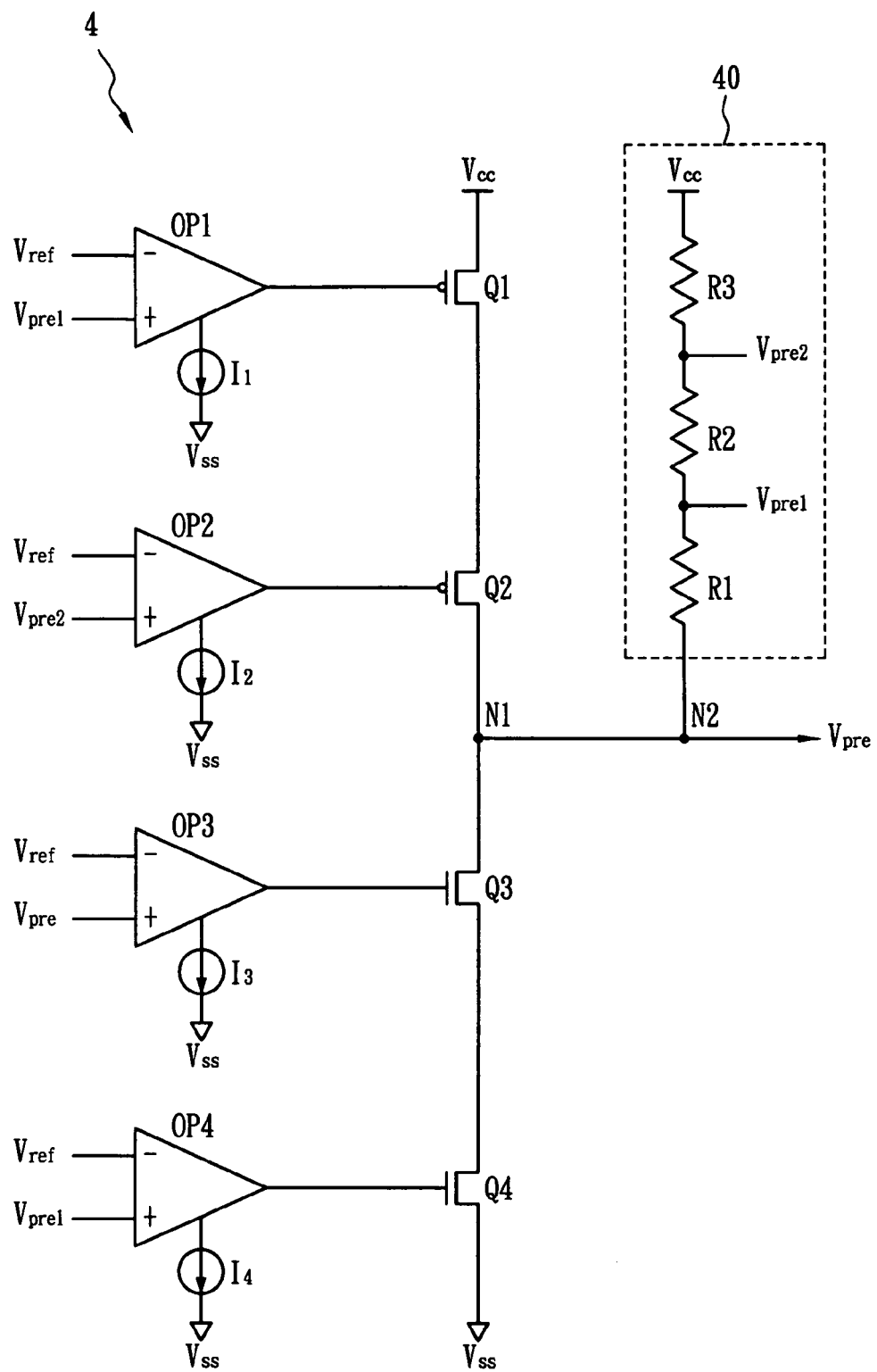
FIG. 7 illustrates the DRAM bit line precharge voltage generator in accordance with a second embodiment of the present invention.

FIG. 7 shows a DRAM bit line precharge voltage generator 4 in accordance with a second embodiment of the present invention. The circuit of FIG. 7 is essentially similar to the circuit of FIG. 6 except addition of a voltage divider 40 and the input signals of the four amplifiers OP1-OP4. The DRAM bit line precharge voltage generator 4 comprises a first amplifier OP1 having a first current source $I_1$, a second amplifier OP2 having a second current source $I_2$, a third amplifier OP3 having a third current source $I_3$, a fourth amplifier OP4 having a fourth current source $I_4$, a first PMOS transistor Q1, a second PMOS transistor Q2, a first NMOS transistor Q3, a second NMOS transistor Q4 and the voltage divider 40. The first amplifier OP1 compares a first precharge voltage $V_{pre1}$ with a reference voltage $V_{ref}$ to control the first PMOS transistors Q1. The second amplifier OP2 compares a second precharge voltage $V_{pre2}$ with the reference voltage $V_{ref}$ to control the second PMOS transistor Q2. The third amplifier OP3 compares a precharge voltage $V_{pre}$ with the reference voltage $V_{ref}$ to control the first NMOS transistor Q3. The fourth amplifier OP4 compares the first precharge voltage $V_{pre1}$ with the reference voltage $V_{ref}$ to control the second NMOS transistor Q4. The relationships among the current sources $I_1$-$I_4$ of FIG. 7 are identical to those of the current sources $I_1$-$I_4$ of FIG. 6. In addition, the physical size relationships among the transistors Q1-Q4 of FIG. 7 are identical to those of the transistors Q1-Q4 of FIG. 6. In this embodiment, only a reference voltage $V_{ref}$ is provided externally, and the first precharge voltage $V_{pre1}$ and the second precharge voltage $V_{pre2}$ are generated from the voltage divider 40 according to the supply voltage source $V_{cc}$ and the precharge voltage $V_{pre}$. The voltage divider 40 comprises a first resistor R1, a second resistor R2, and a third resistor R3, which are connected in series. The first precharge voltage $V_{pre1}$ is retrieved from the node connected between the first resistor R1 and the second resistor R2. The second precharge voltage $V_{pre2}$ is retrieved from the node connected between the second resistor R2 and the third resistor R3. The voltage divider 40 is also used to determine a lower boundary of the precharge voltage $V_{pre}$, and the reference voltage $V_{ref}$ is an upper boundary of the precharge voltage $V_{pre}$ in this embodiment. The lower boundary of the precharge voltage $V_{pre}$ is equal to the reference voltage $V_{ref}$ minus the voltage difference across the first resistor R1 and the second resistor R2. That is, the lower boundary of the precharge voltage $V_{pre}$ is defined as $V_L = V_{ref} - \Delta V$, where $\Delta V = [(R1+R2)/(R1+R2+R3) \times (V_{cc}-V_{pre})]$.

The operation of the second embodiment of the present invention is given below. Referring to FIG. 7, if the precharge voltage $V_{pre}$ is less than the lower boundary of the precharge voltage $V_{pre}$, i.e., $V_L$, implying that $V_{pre1} < V_{ref}$ and $V_{pre2} < V_{ref}$, the first PMOS transistor Q1 and the second PMOS transistor Q2 are turned on; however, the first NMOS transistor Q3 and the second NMOS transistor Q4 are turned off. As a result, the level of the precharge voltage $V_{pre}$ is increased. If the precharge voltage $V_{pre}$ is larger than the reference voltage $V_{ref}$, implying that $V_{pre1} > V_{ref}$ and $V_{pre2} > V_{ref}$, the first PMOS transistor Q1 and the second PMOS transistor Q2 are turned off; however, the first NMOS transistor Q3 and the second NMOS transistor Q4 are turned on. As a result, the precharge voltage $V_{pre}$ is decreased. When the precharge voltage $V_{pre}$ is between the reference voltage $V_{ref}$ and the lower boundary of the reference voltage $V_{ref}$ (i.e., $V_L$), the second PMOS transistor Q2 and the first NMOS transistor Q3 are turned off; thus, the precharged voltage $V_{pre}$ remains and a low standby current is obtained.

Figure 8:
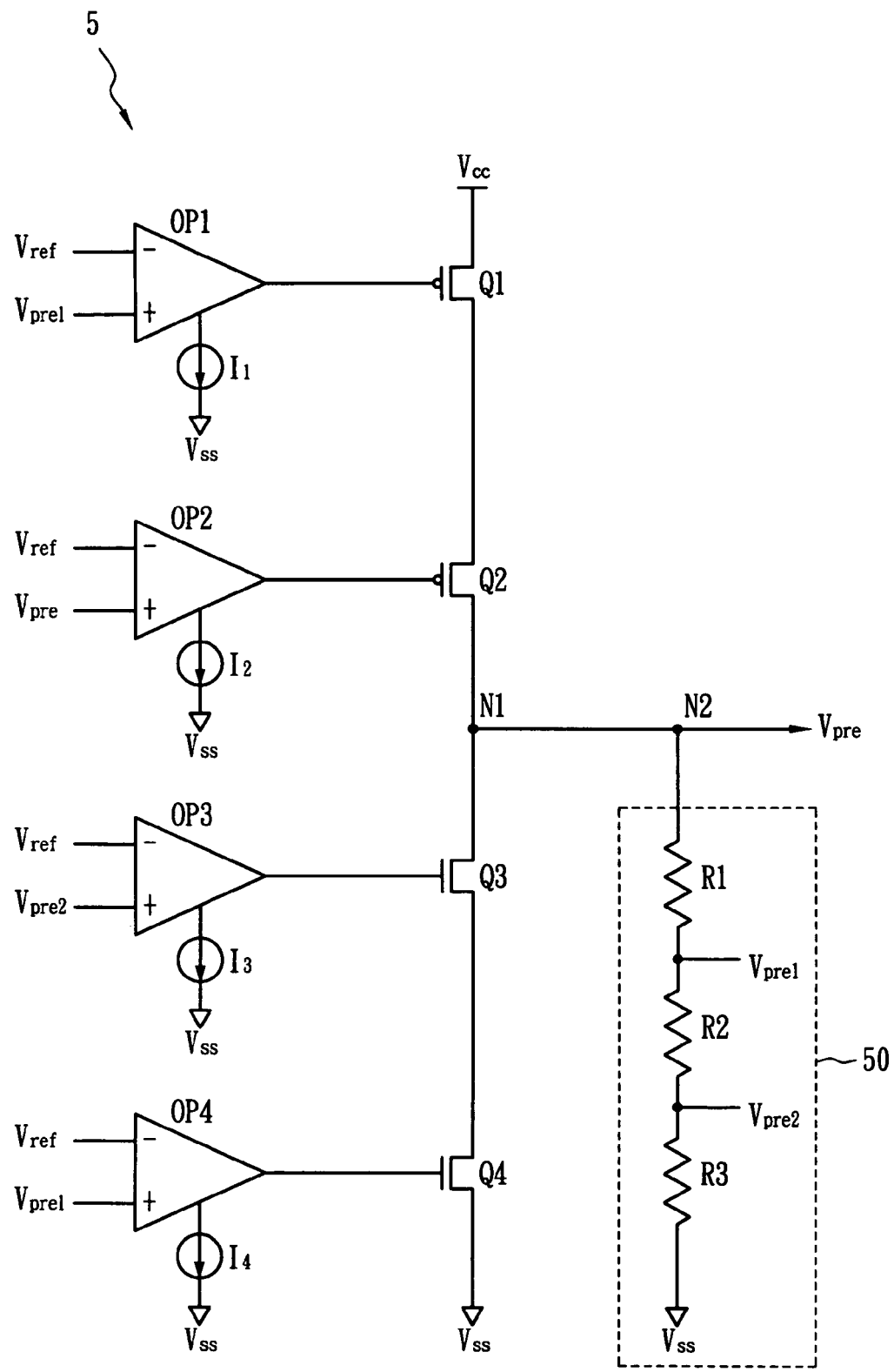
FIG. 8 illustrates the DRAM bit line precharge voltage generator in accordance with a third embodiment of the present invention.

FIG. 8 shows a DRAM bit line precharge voltage generator 5 in accordance with a third embodiment of the present invention. The circuit of FIG. 8 is essentially similar to the circuit of FIG. 7 except rearrangement of a voltage divider 50 and the input signals of the four amplifiers OP1-OP4. The DRAM bit line precharge voltage generator 5 comprises a first amplifier OP1 having a first current source $I_1$, a second amplifier OP2 having a second current source $I_2$, a third amplifier OP3 having a third current source $I_3$, a fourth amplifier OP4 having a fourth current source $I_4$, a first PMOS transistor Q1, a second PMOS transistor Q2, a first NMOS transistor Q3, a second NMOS transistor Q4 and the voltage divider 50. The first amplifier OP1 compares a first precharge voltage $V_{pre1}$ with a reference voltage $V_{ref}$ to control the first PMOS transistors Q1. The second amplifier OP2 compares a precharge voltage $V_{pre}$ with the reference voltage $V_{ref}$ to control the second PMOS transistor Q2. The third amplifier OP3 compares a second precharge voltage $V_{pre2}$ with the reference voltage $V_{ref}$ to control the first NMOS transistor Q3. The fourth amplifier OP4 compares the first precharge voltage $V_{pre1}$ with the reference voltage $V_{ref}$ to control the second NMOS transistor Q4. The relationships among the current sources $I_1$-$I_4$ of FIG. 8 are identical to those of the current sources $I_1$-$I_4$ of FIG. 7. In addition, the physical size relationships among the transistors Q1-Q4 of FIG. 8 are identical to those of the transistors Q1-Q4 of FIG. 7. In this embodiment, only a reference voltage $V_{ref}$ is provided externally, and the first precharge voltage $V_{pre1}$ and the second precharge voltage $V_{pre2}$ are generated from the voltage divider 50 according to the ground voltage source $V_{ss}$ and the precharge voltage $V_{pre}$. The voltage divider 50 comprises a first resistor R1, a second resistor R2, and a third resistor R3, which are connected in series. The first precharge voltage $V_{pre1}$ is retrieved from the node connected between the first resistor R1 and the second resistor R2. The second precharge voltage $V_{pre2}$ is retrieved from the node connected between the second resistor R2 and the third resistor R3. The voltage divider 50 is also used to determine an upper boundary of the precharge voltage $V_{pre}$, and the reference voltage $V_{ref}$ is a lower boundary of the precharge voltage $V_{pre}$ in this embodiment. The upper boundary of the precharge voltage $V_{pre}$ is equal to the reference voltage $V_{ref}$ plus the voltage difference across the first resistor R1 and the second resistor R2. That is, the upper boundary of the precharge voltage $V_{pre}$ is defined as $V_U = V_{ref} + \Delta V$, where $\Delta V = [(R1+R2)/(R1+R2+R3) \times (V_{pre} - V_{ss})]$.

The operation of the second embodiment of the present invention is given below. Referring to FIG. 8, if the precharge voltage $V_{pre}$ is less than the lower boundary of the precharge voltage $V_{pre}$, i.e., $V_{ref}$ implying that $V_{pre1} < V_{ref}$ and $V_{pre2} < V_{ref}$, the first PMOS transistor Q1 and the second PMOS transistor Q2 are turned on; however, the first NMOS transistor Q3 and the second NMOS transistor Q4 are turned off. As a result, the level of the precharge voltage $V_{pre}$ is increased. If the precharge voltage $V_{pre}$ is larger than the upper boundary of the precharge voltage $V_{pre}$ (i.e., $V_U$), implying that $V_{pre1} > V_{ref}$ and $V_{pre2} > V_{ref}$, the first PMOS transistor Q1 and the second PMOS transistor Q2 are turned off; however, the first NMOS transistor Q3 and the second NMOS transistor Q4 are turned on. As a result, the precharge voltage $V_{pre}$ is decreased. When the precharge voltage $V_{pre}$ is between the reference voltage $V_{ref}$ and the upper boundary of the reference voltage $V_{ref}$ (i.e., $V_U$), the second PMOS transistor Q2 and the first NMOS transistor Q3 are turned off; thus, the precharged voltage $V_{pre}$ remains and a low standby current is obtained.

The above-described embodiments of the present invention are intended to be illustrative only. Numerous alternative embodiments may be devised by those skilled in the art without departing from the scope of the following claims.

What is claimed is:

1. A DRAM bit line precharge voltage generator, comprising:
   a first amplifier comparing a first voltage with a precharge voltage to control a first PMOS transistor coupled to a supply voltage source;
   a second amplifier comparing a second voltage with the precharge voltage to control a second PMOS transistor coupled to the first PMOS transistor;
   a third amplifier comparing a third voltage with the precharge voltage to control a first NMOS transistor coupled to the second PMOS transistor; and
   a fourth amplifier comparing the first voltage with the precharge voltage to control a second NMOS transistor coupled to the first NMOS transistor and a ground voltage source;
   wherein the precharge voltage is retrieved from an output node connected between the second PMOS transistor and the first NMOS transistor.

2. The DRAM bit line precharge voltage generator of claim 1, wherein each of the first, second, third and fourth amplifier has a first current source, a second current source, a third current source and a fourth current source, respectively.

3. The DRAM bit line precharge voltage generator of claim 1, wherein the third voltage and the second voltage are an upper boundary and a lower boundary of the precharge voltage, respectively.

4. The DRAM bit line precharge voltage generator of claim 2, wherein the currents of the second current source and the third current source are larger than those of the first current source and the fourth current source, respectively.

5. The DRAM bit line precharge voltage generator of claim 4, wherein the currents of the first current source and the second current source are equal to those of the fourth current source and the third current source, respectively.

6. The DRAM bit line precharge voltage generator of claim 1, wherein the first voltage is between the second voltage and the third voltage.

7. A DRAM bit line precharge voltage generator, comprising:
   a first amplifier comparing a reference voltage with a first precharge voltage to control a first PMOS transistor coupled to a supply voltage source;
   a second amplifier comparing the reference voltage with a second precharge voltage to control a second PMOS transistor coupled to the first PMOS transistor;
   a third amplifier comparing the reference voltage with a precharge voltage to control a first NMOS transistor coupled to the second PMOS transistor;
   a fourth amplifier comparing the reference voltage with the first precharge voltage to control a second NMOS transistor coupled to the first NMOS transistor and a ground voltage source; and
   a voltage divider generating the first precharge voltage and the second precharge voltage according to the supply voltage source and the precharge voltage;
   wherein the precharge voltage is retrieved from an output node connected between the second PMOS transistor and the first NMOS transistor.

8. The DRAM bit line precharge voltage generator of claim 7, wherein each of the first, second, third and fourth amplifier has a first current source, a second current source, a third current source and a fourth current source, respectively.

9. The DRAM bit line precharge voltage generator of claim 7, wherein the reference voltage is an upper boundary of the precharge voltage and the voltage divider determines a low boundary of the precharge voltage.

10. The DRAM bit line precharge voltage generator of claim 7, wherein the voltage divider comprises a first resistor, a second resistor and a third resistor, which are connected in series.

11. The DRAM bit line precharge voltage generator of claim 10, wherein the first precharge voltage is retrieved from a node connected between the first resistor and the second resistor, and the second precharge voltage is retrieved from a node connected between the second resistor and the third resistor.

12. The DRAM bit line precharge voltage generator of claim 10, wherein a lower boundary of the precharge voltage is equal to the reference voltage minus the voltage difference across the first resistor and the second resistor.

13. The DRAM bit line precharge voltage generator of claim 8, wherein the currents of the second current source and the third current source are larger than those of the first current source and the fourth current source, respectively.

14. A DRAM bit line precharge voltage generator, comprising:
- a first amplifier comparing a reference voltage with a first precharge voltage to control a first PMOS transistor coupled to a supply voltage source;
- a second amplifier comparing the reference voltage with a precharge voltage to control a second PMOS transistor coupled to the first PMOS transistor;
- a third amplifier comparing the reference voltage with a second precharge voltage to control a first NMOS transistor coupled to the second PMOS transistor;
- a fourth amplifier comparing the reference voltage with the first precharge voltage to control a second NMOS transistor coupled to the first NMOS transistor and a ground voltage source; and
- a voltage divider generating the first precharge voltage and the second precharge voltage according to the ground voltage source and the precharge voltage;

wherein the precharge voltage is retrieved from an output node connected between the second PMOS transistor and the first NMOS transistor.

15. The DRAM bit line precharge voltage generator of claim 14, wherein each of the first, second, third and fourth amplifier has a first current source, a second current source, a third current source and a fourth current source, respectively.

16. The DRAM bit line precharge voltage generator of claim 14, wherein the reference voltage is a lower boundary of the precharge voltage and the voltage divider determines an upper boundary of the precharge voltage.

17. The DRAM bit line precharge voltage generator of claim 14, wherein the voltage divider comprises a first resistor, a second resistor and a third resistor, which are connected in series.

18. The DRAM bit line precharge voltage generator of claim 17, wherein the first precharge voltage is retrieved from a node connected between the first resistor and the second resistor, and the second precharge voltage is retrieved from a node connected between the second resistor and the third resistor.

19. The DRAM bit line precharge voltage generator of claim 17, wherein an upper boundary of the precharge voltage is equal to the reference voltage plus the voltage difference across the first resistor and the second resistor.

20. The DRAM bit line precharge voltage generator of claim 15, wherein the currents of the second current source and the third current source are larger than those of the first current source and the fourth current source, respectively.

* * * * *